(12) United States Patent
Shimizu et al.

(10) Patent No.: US 7,659,190 B2
(45) Date of Patent: Feb. 9, 2010

(54) METHOD FOR PRODUCING A GROUP III-V COMPOUND SEMICONDUCTOR

(75) Inventors: Masaya Shimizu, Ehime (JP); Shinichi Morishima, Ibaraki (JP); Makoto Sasaki, Ibaraki (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 17 days.

(21) Appl. No.: 11/140,236

(22) Filed: May 27, 2005

(65) Prior Publication Data

US 2006/0022308 A1 Feb. 2, 2006

Related U.S. Application Data

(63) Continuation of application No. PCT/JP03/14870, filed on Nov. 21, 2003.

(30) Foreign Application Priority Data

Nov. 29, 2002 (JP) .............................. 2002-347562

(51) Int. Cl.
*H01L 21/28* (2006.01)
*H01L 21/3205* (2006.01)

(52) U.S. Cl. ...................... 438/602; 438/604

(58) Field of Classification Search ................ 438/46, 438/477, 479, 565, 589, 602, 604, 706; 257/11, 257/94, 96, 97, 102, 103
See application file for complete search history.

(56) References Cited

U.S. PATENT DOCUMENTS

| 5,122,845 | A | 6/1992 | Manabe et al. |
| 5,290,393 | A | 3/1994 | Nakamura |
| 5,587,014 | A | 12/1996 | Iyechika et al. |
| 5,815,520 | A * | 9/1998 | Furushima ................ 372/45.01 |
| 2001/0010941 | A1 * | 8/2001 | Morita ........................ 438/46 |

FOREIGN PATENT DOCUMENTS

| JP | 2-229476 A | 9/1990 |
| JP | 4-297023 A | 10/1992 |
| JP | 9-148626 A | 6/1997 |
| JP | 2002-161000 A | 6/2002 |

OTHER PUBLICATIONS

Kimura, R., et al., "Molecular Beam Epitaxial Growth of GaN on (0001)$Al_2O_3$ Using an Ultrathin Amorphous Buffer Layer Deposited at Low Temperature", *Jpn. J. Appl. Phys.*, vol. 30, pp. 1039-1043 (2000).

* cited by examiner

*Primary Examiner*—Thien F Tran
(74) *Attorney, Agent, or Firm*—Panitch Schwarze Belisario & Nadel LLP

(57) ABSTRACT

A Group III-V compound semiconductor includes, at least, a substrate, a buffer layer of the general formula $In_uGa_vAl_wN$ (wherein, $0 \leq u \leq 1$, $0 \leq v \leq 1$, $0 \leq w \leq 1$, $u+v+w=1$) and a Group III-V compound semiconductor crystal layer of the general formula $In_xGa_yAl_zN$ (wherein, $0 \leq x \leq 1$, $0 \leq y \leq 1$, $0 \leq z \leq 1$, $x+y+z=1$), in this order, wherein the buffer layer has a thickness of at least about 5 Å and not more than about 90 Å. A method is provided for producing the Group III-V compound semiconductor, including forming a buffer layer of the general formula $In_uGa_vAl_wN$ on a substrate to give a thickness of at least about 5 Å and not more than about 90 Å at temperatures lower than the growing temperature of the compound semiconductor crystal layer before growing the compound semiconductor crystal layer, and then growing a Group III-V compound semiconductor crystal layer of the general formula $In_xGa_yAl_zN$ on the buffer layer.

12 Claims, No Drawings

METHOD FOR PRODUCING A GROUP III-V COMPOUND SEMICONDUCTOR

CROSS-REFERENCE TO RELATED APPLICATIONS

This application is a continuation of International Application No. PCT/JP2003/014870, filed Nov. 21, 2003, which was published in the Japanese language on Jun. 17, 2004, under International Publication No. WO 2004/051718 A1 and the disclosure of which is incorporated herein by reference.

BACKGROUND OF THE INVENTION

The present invention relates to a Group III-V compound semiconductor comprising, at least, a substrate, a buffer layer and a Group III-V compound semiconductor crystal layer of the general formula $In_xGa_yAl_zN$ (wherein, $0 \leq x \leq 1$, $0 \leq y \leq 1$, $0 \leq z \leq 1$, $x+y+z=1$), in this order. The invention also relates to a method of producing the semiconductor.

As materials of light-emitting devices such as light-emitting diodes of ultraviolet or blue, laser diodes of ultraviolet or blue, and the like, there are known Group III-V (of the Periodic Table) compound semiconductors having a Group III-V compound semiconductor crystal layer of the general formula $In_xGa_yAl_zN$ (wherein, $x+y+z=1$, $0 \leq x \leq 1$, $0 \leq y \leq 1$, $0 \leq z \leq 1$). Hereinafter, x, y an z in this general formula are sometimes designated as the InN crystal mixing ratio, GaN crystal mixing ratio and AlN crystal mixing ratio, respectively. The Group III-V compound semiconductors particularly containing InN in an amount of 10% or more in terms of the crystal mixing ratio can control light-emitting wavelengths in the visible region corresponding to the InN mixed ratio, and therefore, are particularly important for display applications.

On the other hand, with the Group III-V compound semiconductor crystal layers as described above, an excellent crystal is not obtained in bulk growth, because homo-epitaxial growth using itself as a substrate material is difficult. Therefore, hetero-epitaxial crystal growth is generally conducted on a substrate, which is a different material from the material of crystal layers grown thereon. Since the number of substrates showing lattice conformity is small, however, in general, substrates such as α-alumina (lattice non-conformity 13.8%), silicon carbide (lattice mismatch 3.4%), ZnO (lattice non-conformity 2.0%), silicon (lattice non-conformity 20.4%), and the like showing more significant lattice non-conformity, are used under actual conditions.

It is known that with crystals thus grown by hetero-epitaxial growth, growth of a single crystal of large area is very difficult, and many defects are contained therein. In general, when a semiconductor material is used as a light-emitting device, crystal defects and impurities form a non-radiation center, exerting a reverse influence on properties, such as light-emitting efficiency and the like. Therefore, it is indispensable to reduce crystal defects and impurities as much as possible to improve crystallinity for use as a light-emitting device. There are reports on improvement in crystallinity by two-step growth in which a buffer layer made of AlN, GaN or the like having a thickness of 200 to 500 Å is grown, and a crystal is grown on this at high temperatures (see Japanese Laid-Open Patent Application Nos. JP 2-229476 A and JP 4-297023 A).

BRIEF SUMMARY OF THE INVENTION

The present invention provides a Group III-V compound semiconductor having improved crystallinity and also provides a method for producing the semiconductor.

The present inventors have intensively investigated to find a Group III-V compound semiconductor having improved crystallinity. As a result, they have found that a Group III-V compound semiconductor having a buffer layer extremely thinner than a conventional film thickness is excellent in crystallinity and can be used to produce a light-emitting device with excellent properties, such as light-emitting efficiency and the like, leading to completion of the present invention.

Namely, the present invention relates to:

(1) a Group III-V compound semiconductor having excellent practicability comprising, at least, a substrate, a buffer layer of the general formula $In_uGa_vAl_wN$ (wherein, $0 \leq u \leq 1$, $0 \leq v \leq 1$, $0 \leq w \leq 1$, $u+v+w=1$) and a Group III-V compound semiconductor crystal layer of the general formula $In_xGa_yAl_zN$ (wherein, $0 \leq x \leq 1$, $0 \leq y \leq 1$, $0 \leq z \leq 1$, $x+y+z=1$), in this order, wherein the buffer layer has a thickness of at least about 5 Å and not more than about 90 Å.

Further, the present invention relates to:

(2) the semiconductor according to (1), wherein the buffer layer is in the form of an amorphous and/or fine crystal, (3) the semiconductor according to (1) or (2), wherein the substrate is selected from sapphire, ZnO, GaAs, NGO (NdGaO$_3$), spinel (MgAl$_2$O$_4$) and ZrB$_2$, and (4) the semiconductor according to any of (1) to (3), wherein the substrate has pits having a major axis of at least about 20 nm and having a ratio of the maximum depth to the major axis of at least about 0.05 at a density of at least about $1 \times 10^7$ cm$^{-2}$ on the surface of the buffer layer side.

Furthermore, the present invention relates to a method for producing a Group III-V compound semiconductor wherein, in growing a Group III-V compound semiconductor crystal layer of the general formula $In_xGa_yAl_zN$ (wherein, $0 \leq x \leq 1$, $0 \leq y \leq 1$, $0 \leq z \leq 1$, $x+y+z=1$) on a substrate, a buffer layer of the general formula $In_uGa_vAl_wN$ (wherein, $0 \leq u \leq 1$, $0 \leq v \leq 1$, $0 \leq w \leq 1$, $u+v+w=1$) is formed to give a thickness of at least about 5 Å and not more than about 90 Å at temperatures lower than the growing temperature of the compound semiconductor crystal layer before growing the compound semiconductor crystal layer, and then, the compound semiconductor crystal layer is grown.

Still further, the present invention relates to:

(6) the production method according to (5), wherein the buffer layer is in the form of an amorphous and/or fine crystal, (7) the production method according to (5) or (6), wherein the substrate is selected from sapphire, ZnO, GaAs, NGO (NdGaO$_3$), spinel (MgAl$_2$O$_4$) and ZrB$_2$, (8) the production method according to any of (5) to (7), wherein a substrate is used having pits having a major axis of at least about 20 nm and having a ratio of the maximum depth to the major axis of at least about 0.05 at a density of at least about $1 \times 10^7$ cm$^{-2}$ on the surface on which the buffer layer is to be laminated, and (9) the production method according to any of (5) to (8), wherein, before formation of the buffer layer, the surface of the substrate on which the buffer layer is to be laminated is subjected to vapor phase etching to form pits having a major axis of at least about 20 nm and having a ratio of the maximum depth to the major axis of at least about 0.05 at a density of at least about $1 \times 10^7$ cm$^{-2}$.

DETAILED DESCRIPTION OF THE INVENTION

The present invention will be illustrated in detail below. The Group III-V compound semiconductor in the present invention is a compound semiconductor having a laminated structure comprising, at least, a substrate, a buffer layer and a compound semiconductor crystal layer of the general formula $In_xGa_yAl_zN$ (wherein, $x+y+z=1$, $0 \leq x \leq 1$, $0 \leq y \leq 1$, $0 \leq z \leq 1$), in this order.

The buffer layer in the present invention includes layers composed of materials represented by $In_uGa_vAl_wN$ (wherein, $0 \leq u \leq 1$, $0 \leq v \leq 1$, $0 \leq w \leq 1$, $u+v+w=1$). The thickness of the buffer layer is about 5 to 90 Å, preferably about 10 to 90 Å, and especially preferably about 20 to 80 Å. When the thickness is smaller than about 5 Å or larger than about 90 Å, the effect of the buffer layer is deteriorated undesirably. By using such a thin buffer layer, a Group III-V compound semiconductor crystal layer having low crystal deficiency density can be grown with good reproducibility.

For evaluating deficiency density, there are mentioned a method of observing a dislocation line by a transmission electron microscope, a method of observing pits on a surface by an atomic force microprobe, a method of observing pits obtained by conducting re-growth on the surface of a crystal under specific conditions (growth pit method), an etch pit method of etching the surface of a crystal under vapor phase or liquid phase to generate pits corresponding to defects, a cathode luminescence method of observing fluorescence by excitation of electron beam, a method of measuring the Full Width at half maximum of a rocking curve of X-ray, and the like. Of them, the method of measuring an X-ray rocking curve is a non-destructive test, and by measuring several different reflection points of X-ray, edge dislocation density and screw dislocation density can be measured separately. That is, this method can be suitably used as a method for evaluating the crystallinity of the compound semiconductor.

As the method of forming a buffer layer of the present invention, there can be used known methods such as an organometal vapor phase growth method (hereinafter sometimes referred to as MOVPE method), molecular beam epitaxy method (hereinafter sometimes referred to as MBE method), sputtering method, hydride vapor phase epitaxy method (hereinafter sometimes referred to as HVPE method), vapor deposition method, plasma vapor phase deposition method (hereinafter sometimes referred to as plasma CVD method), thermal vapor phase deposition method (hereinafter sometimes referred to as thermal CVD method), and the like. Of these deposition methods, an MBE method and a MOVPE method excellent in control of the thickness of a thin film can be suitably used. When an MBE method and MOVPE method are used, the growth temperature of the buffer layer is preferably about 300 to 800° C., further preferably about 350 to 700° C., particularly preferably about 400 to 650° C. When the growth temperature of a buffer layer is lower than about 300° C., growth speed decreases non-practically, and when higher than about 800° C., the effect as a buffer layer becomes undesirably unremarkable.

Specific examples of the buffer layer of the present invention include GaN, AlN, InGaAlN having an AlN crystal mixing ratio of at least about 50%, and the like. In these buffer layers, when AlN crystal mixing ratio increases, thermal stability tends to increase, and consequently, there can be expected tolerance of a process after growth of a buffer layer. In growing a Group III-V compound semiconductor crystal layer after growth of a buffer layer, it is preferable that the growth temperature of the compound semiconductor crystal layer is sufficiently high. Specific growth temperatures of the compound semiconductor crystal layer include temperatures of at least 1000° C. Though detailed reasons are not clear, it is believed that by growing the compound semiconductor crystal layer at such relatively high temperatures, there occur an effect of promoting crystallization of a buffer layer of the present invention, an effect of enhancing an efficiency of decomposition of a raw material in growing the compound semiconductor crystal layer, and the like. Once the compound semiconductor crystal layer having high crystallinity grows at high temperatures, a layer showing good crystallinity even at relatively low temperatures of about 800° C. can be grown on this layer.

As the method for producing the Group III-V compound semiconductor crystal layer to be grown on a buffer layer of the present invention, there are listed an MBE method, MOVPE method, HVPE method, and the like. When an MBE method is used, a gas source molecular beam epitaxy (hereinafter sometimes referred to as GSMBE) method is generally used, which is a method of feeding under gas condition a nitrogen gas, ammonia and other nitrogen compounds as a nitrogen raw material. In this case, a nitrogen raw material is chemically inactive, and consequently a nitrogen atom is not easily incorporated in a crystal, in some cases. In this case, a nitrogen raw material is excited by microwave and the like to give a nitrogen raw material which is fed under active conditions. Thus, efficiency of incorporating nitrogen can be increased.

Next, the production method will be described according to an MOVPE method in the case of production of a buffer layer and Group III-V compound semiconductor crystal layer in the present invention. In the case of an MOVPE method, raw materials as described below can be used. Namely, Group III raw materials include trialkylgallium of the general formula $R_1R_2R_3Ga$ (wherein, $R_1$, $R_2$ and $R_3$ represent a lower alkyl group having 1 to 4 carbon atoms), such as trimethylgallium [$(CH_3)_3Ga$, hereinafter sometimes designated as TMG], triethylgallium [$(C_2H_5)_3Ga$, hereinafter sometimes designated as TEG] and the like; trialkylaluminum of the general formula $R_1R_2R_3Al$ (wherein, $R_1$, $R_2$ and $R_3$ are as defined above), such as trimethylaluminum [$(CH_3)_3Al$, hereinafter sometimes designated as TMA], triethylaluminum [$(C_2H_5)_3Al$, hereinafter sometimes designated as TEA], triisobutylaluminum [$(i-C_4H_9)_3Al$], and the like; trimethylaminealane [$(CH_3)_3N:AlH_3$], trialkylindium of the general formula $R_1R_2R_3In$ (wherein, $R_1$, $R_2$ and $R_3$ are as defined above), such as trimethylindium [$(CH_3)_3In$, hereinafter sometimes designated as TMI], triethylindium [$(C_2H_5)_3In$] and the like. These are used alone or in admixture.

Next, Group V raw materials include ammonia, hydrazine, methylhydrazine, 1,1-dimethylhydrazine, 1,2-dimethylhydrazine, t-butylamine, ethylenediamine, and the like. These are used alone or in admixture. Among these raw material, ammonia and hydrazine contain no carbon atom in the molecule. That is, these cause little contamination with carbon in a semiconductor and consequently are suitable.

As p type dopants of Group III-V compound semiconductors, Group II elements are important. Specific examples thereof include Mg, Zn, Cd, Hg and Be, and of them, Mg with which p type dopants having low resistance can be easily made is preferable. As raw materials of Mg dopants, organometal compounds of the general formula $(RC_5H_4)_2Mg$ (wherein, R represents hydrogen or lower alkyl group having 1 to 4 carbon atoms), such as:

biscyclopentadienylmagnesium,
    bismethylcyclopentadienylmagnesium,
    bisethylcyclopentadienylmagnesium,
    bis-n-propylcyclopentadienylmagnesium,
    bis-i-propylcyclopentadienylmagnesium, and the like are suitable, since they have suitable vapor pressure.

As n type dopants of Group III-V compound semiconductors, Group IV elements and Group VI elements are important. Specific examples thereof include Si, Ge, O, and of them, Si with which n type dopants having low resistance can be easily made and having high purity of raw material is obtained is preferable. As raw materials of Si dopants, silane ($SiH_4$), disilane ($Si_2H_6$) and the like are suitable.

As carrier gases, gases such as hydrogen, nitrogen, argon, helium and the like can be used alone or in admixture. Here, if hydrogen is contained in a carrier gas, when the compound semiconductor having high InN crystal mixing ratio is grown, sufficient crystallinity is not obtained in some cases. In this case, it is necessary to lower hydrogen partial pressure in a carrier gas. Preferable hydrogen partial pressure in a carrier gas is not greater than about 0.1 atom.

Of these carrier gases, hydrogen and helium are mentioned, since they have large kinetic viscosity coefficient and do not cause convection easily. Here, helium is expensive as compared with other gases, and if hydrogen is used, when the compound semiconductor having high InN crystal mixing ratio as described above is grown, sufficient crystallinity is not obtained in some cases. Nitrogen and argon are relatively cheap, and therefore can be suitably used in the case of use of large amounts of a carrier gas.

Next, the substrate used in the present invention will be illustrated. As the substrate for growth of a crystal of a Group III-V compound semiconductor, sapphire, ZnO, GaAs, NGO ($NdGaO_3$), spinel ($MgAl_2O_4$), $ZrB_2$ and the like are used. Particularly, sapphire is important since it is transparent, and a crystal of high quality having large area is obtained from this.

By shifting the direction of the surface of a substrate slightly from crystal orientation, flatness, crystallinity and the like of each layer to be grown on it are improved in some cases. Hereinafter, dislocation of the surface of a substrate from crystal orientation is sometimes described as "off angle." The off angle is preferably in the range of not more than about 5°, more preferably not more than about 2°, most preferably at least about 0.1° and not more than about 0.5°. The off angle direction, in the case of a c plane of the substrate, can be the a axis direction, the m axis direction or its intermediate direction, and the like.

As the substrate, substrates having pits having a major axis of at least about 20 nm and having a ratio of the maximum depth to the major axis of at least about 0.05 at a density of at least about $1 \times 10^7$ $cm^{-2}$ are preferably used. By forming a thin buffer layer as described above on a surface having such pits, a Group III-V compound semiconductor having extremely excellent crystallinity is obtained.

As the method of forming pits on a substrate, a vapor phase etching method is desirably used, and according to this method, dimensions (maximum depth, major axis and the like), density and the like of pits can be controlled by changing etching time, temperature, the kind of a gas for etching, its concentration and the like.

As the gas for etching, there is generally used at least one gas selected from the group consisting of compounds containing a halogen element and Group V element, and hydrogen halides.

Here, as the compound containing a halogen element and Group V element, there are listed, for example, arsenic halides such as arsenic trichloride and the like, phosphorus halides such as phosphorus trichloride and the like. As the hydrogen halide, there are listed, for example, hydrogen chloride, hydrogen bromide, hydrogen iodide, and the like. These gases can also be used in admixture of two or more.

Of these gases, hydrogen chloride is preferably used.

Vapor phase etching may be performed in a vapor phase growth apparatus or in other apparatus than this, and in the former case, an inner wall and the like of a vapor phase growth apparatus can be cleaned simultaneously by etching, and therefore, the former is preferably adopted.

The maximum depth (depth of deepest portion) of a pit is at least about 1 nm, preferably about 1 to 100 nm, more preferably about 1 to 50 nm, and most preferably about 1 to 30 nm.

The major axis of a pit is at least about 20 nm, preferably about 20 to 1000 nm, more preferably about 20 to 500 nm, and most preferably about 20 to 300 nm. The ratio of the maximum depth to the major axis is at least about 0.05, preferably about 0.05 to 2, more preferably about 0.05 to 1, and most preferably 0.05 to 0.5.

The density of a pit is at least about $1 \times 10^7$ $cm^{-2}$, preferably about $5 \times 10^7$ to about $1 \times 10^{10}$ $cm^{-2}$, more preferably about $1 \times 10^8$ to about $1 \times 10^{10}$ $cm^{-2}$, and most preferably about $2 \times 10^8$ to about $1 \times 10^{10}$ $cm^{-2}$.

Pits on a substrate, before formation of a semiconductor, can be measured using an atomic force microprobe (hereinafter abbreviated as AFM). After formation of a semiconductor, pits can be measured by a transmission electron microscope (hereinafter abbreviated as TEM).

The present invention can be suitably used for so-called hetero-epitaxial growth in which on a substrate made of a different material from the intended compound semiconductor, a crystal layer of the compound semiconductor is grown, as described above. However, this can be used also when a crystal layer of the compound semiconductor is used as a template, and on this, a crystal layer of the compound semiconductor is further grown. This case may prevent penetration dislocation present in the compound semiconductor crystal layer used as a template from piercing through to the compound semiconductor layer, and the production method of the present invention can be preferably used. In this case, as the compound semiconductor crystal layer which can be used as a template, there are mentioned the compound semiconductor crystal layers grown by a MBE method, MOVPE method, HVPE method and the like directly or via a buffer layer on a substrate, or thus grown compound semiconductor crystal layers peeled from a substrate, and the like. Additionally, the compound semiconductor crystal layers grown in liquid phase from melted liquid of Ga, Na and the like, the compound semiconductor crystal layers further grown on this compound semiconductor crystal layer, are mentioned.

Here, light emitting mechanisms of LED are roughly classified into two groups. One is a mechanism in which injected electrons and holes re-combine via a level formed by impurities in a band gap, and this is generally called impurity light emission. Another is a mechanism in which injected electrons and holes combine without a level formed by impurities, and in this case light emission at wavelength corresponding approximately to band gap is obtained. This is called band edge light emission. In the case of impurity light emission, light-emitting spectrum is generally broad. On the other hand, band edge light emission has sharp light emitting spectrum, and when high purity is necessary, band edge light emission is preferable. In the case of impurity light emission, re-combination of electrons and holes via impurity level is utilized, consequently, there is required impurity levels of sufficient number for arresting electrons injected or holes, and in general, when impurities are doped at high concentration, its crystal quality deteriorates. Namely, the number of impurity levels which can be formed in a crystal of high quality is limited. In this case, if the injection amount of electrons and holes increases, the number of impurity levels is deficient, and re-combination of electrons and holes without impurity levels occurs. That is, with high electric current, light emission efficiency lowers.

On the other hand, in the case of band edge light emission, light emission without impurity level is utilized, and consequently, such lowering of light emission efficiency does not occur. Therefore, when injection of high electric current is necessary, band edge light emission is preferable. In contrast, the compound semiconductor has a direct interband transition type band gap, and the band gap can be formed in visible region depending on its composition. Therefore, by using this layer as a light emission layer, a light-emitting element of high efficiency by band edge light emission can be formed without using impurity light emission. In band edge light emission, light emission power can be concentrated in a narrow wavelength range, and the light-emitting spectrum becomes sharp, and high color purity can be attained. The Group III-V compound semiconductor of the present invention can be suitably used particularly in an application in which high crystal quality is required, such as band edge light emission.

Specific examples of light-emitting devices for which the present invention can be used will be described below. Basically, a light-emitting device has a structure in which the compound semiconductor crystal layer of an n type, a light-emitting layer composed of the compound semiconductor crystal and the compound semiconductor crystal layer of a p type are laminated on a substrate. By placing a light-emitting layer between an n type layer and a p type layer, a light-emitting device of high efficiency showing low driving voltage can be obtained. Between an n type layer and a light-emitting layer, and between a light emitting layer and a p type layer, several layers different in composition, conductivity and doping concentration may be inserted.

Since n type layers having higher conductivity are obtained easily as compared with p type layers, an n type layer, a light-emitting layer and a p type layer are grown in general in this order. The present invention can be used in growing the compound semiconductor crystal layer to be initially grown on a substrate. That is, a compound semiconductor having high crystallinity is obtained by forming a buffer layer of the present invention on a substrate, and then, growing the compound semiconductor crystal layer. By laminating each layer necessary for forming a light-emitting device thereof, a light-emitting device constituted of layers of totally high crystallinity can be obtained.

Next, the light-emitting layer will be described.

For realizing a light-emitting device by band edge light emission, the amount of impurities contained in a light-emitting layer should be suppressed to a low level. Specifically, it is preferable that the concentrations of Si, Ge and Group II elements all be not greater than about $10^{17}$ cm$^{-3}$. In the case of band edge light emission, light emission color is determined by the composition of Group III elements in a light-emitting layer. In the case of light emission in a visible part, In concentration is preferably at least about 10%. When In concentration is smaller than about 10%, lights to be emitted are almost ultraviolet rays, and sufficient brightness cannot be felt. When In concentration is increased, the light-emitting wavelength elongates and light-emitting wavelength can be controlled from violet to blue and green. The thickness of a light-emitting layer is preferably at least about 5 Å and not more than about 300 Å. More preferably, it is at least about 10 Å and not more than about 100 Å. If the thickness is smaller than about 5 Å or larger than about 300 Å, when a light-emitting device is used using the compound semiconductor, light-emitting efficiency is not sufficient.

For efficient re-combination of charges injected in a light-emitting layer, a so-called double hetero structure having a light-emitting layer sandwiched by layers having larger band gap than this can be suitably used. Hereinafter, a layer adjacent to a light-emitting layer and having larger band gap than a light-emitting layer is designated as a charge injection layer. It is preferable that the difference in band gap between a charge injection layer and a light-emitting layer is at least about 0.1 eV. When the difference in band gap between a charge injection layer and a light-emitting layer is smaller than about 0.1 eV, enclosure of carriers into a light-emitting layer is not sufficient and light-emitting efficiency lowers. More preferably, it is at least about 0.3 eV. Here, when the band gap of a charge injection layer is over about 5 eV, voltage necessary for charge injection increases, and therefore, it is preferable that the band gap of a charge injection layer be not more than about 5 eV.

The thickness of a charge injection layer is about 10 Å and not more than about 5000 Å. When the thickness of a charge injection layer is smaller than about 5 Å or larger than about 5000 Å, light-emitting efficiency lowers undesirably. More preferably, it is about 10 Å and not more than about 2000 Å. One light-emitting layer may exist, and a plurality of light-emitting layers may also exist. As an example of such a structure, there is a laminated structure of (2n+1) layers in which n light-emitting layers and (n+1) layers having larger band gap than the light-emitting layer are laminated alternately. Here, n means a positive integer, and preferably 1 and not more than about 50, more preferably 1 and not more than about 30. When n is larger than about 50, light-emitting efficiency decreases and a longer time is necessary for growth, relatively undesirably. Such a structure having a plurality of light-emitting layers is particularly useful when a semiconductor laser requiring strong light output is produced.

In the case of production of a Group III-V compound semiconductor according to the present invention using an MOVPE method, at least one gas selected from the group consisting of compounds containing a halogen element and a Group V element, and hydrogen halides is introduced before initiation of vapor phase growth. Then, an inner wall and/or substrate surface upstream of a reaction tube is subjected to vapor phase etching. Thus, the compound semiconductor of excellent crystal quality is obtained with good reproducibility in some cases.

Compounds containing a halogen element and a Group V element in the above-mentioned etching include arsenic trichloride, phosphorus trichloride and the like. The hydrogen halides include hydrogen chloride, hydrogen bromide and hydrogen iodide. Of these gases, hydrogen chloride is preferable.

Compounds containing a halogen element and a Group V element in the present invention are believed to obtain a preferable etching effect, since they decompose Group III-V compound semiconductors piled on the inner wall of a reaction tube at high temperatures or decomposition products thereof and the like. Thus, the inner wall of a reaction tube can be subjected to vapor phase etching before mounting a substrate on a susceptor to effect crystal growth.

In the present invention, the object of vapor phase etching may not be the whole inner wall of a reaction tube, and mentioned are the surface of a susceptor on which a substrate is installed, the surrounding inner walls of a reaction tube and the inner walls of a reaction tube at upstream side of gas flow, and the like. More specifically, when a blowing tube and the like for appropriately introducing a gas flow onto a substrate are provided at an upstream side of a substrate, these surfaces are also mentioned as an object. It is preferable that a substrate is also an object in addition to the inner walls of a reaction tube.

The method for producing a Group III-V compound semiconductor of the present invention will be specifically illustrated. A substrate made of a material different from a compound semiconductor film to be grown, such as α-alumina, silicon carbide or silicon and the like, is set on a reaction tube. Then, a carrier gas, such as hydrogen and the like, is flowed and heated, and under this condition, at least one gas selected from the group consisting of compounds containing a halogen element and a Group V element, and hydrogen halides is introduced. A piled substance decomposed by the gas is discharged together with a carrier gas. Thereafter, vapor phase growth is conducted. Thus, decrease in crystallinity by a piled substance disappears and an excellent single crystal is obtained.

TMG and ammonia as a raw material and hydrogen as a carrier gas, a non-doped GaN layer of 5 μm was grown.

Feeding of TMG and heating of a substrate were stopped and the temperature was lowered down to 620° C. Then, feeding of ammonia was stopped and cooled down to room temperature.

Here, SLM and sccm are units of gas flow rate, and 1 SLM indicates that a gas of weight occupying a volume of 1 liter under standard state flow per minute, and 1000 sccm corresponds to 1 SLM.

After cooling to room temperature, a sample removed from the growth furnace was observed by a microscope to evaluate surface condition, and X ray rocking curves of (004) and (302) reflection were measured, and crystallinity of tilt and twist was evaluated. The results are shown in Table 1.

TABLE 1

| | Thickness of buffer layer | Surface condition | (004) Full Width at half maximum (tilt) | (302) Full Width at half maximum | Twist |
|---|---|---|---|---|---|
| Example 1 | 33 Å | Mirror surface | 238 seconds | 615 seconds | 701 seconds |
| Example 2 | 67 Å | Mirror surface | 244 seconds | 729 seconds | 831 seconds |
| Example 3 | 67 Å | Mirror surface | 291 seconds | 442 seconds | 504 seconds |
| Comparative example 1 | 100 Å | Mirror surface | 322 seconds | 906 seconds | 1033 seconds |
| Comparative example 2 | 200 Å | Mirror surface | 365 seconds | 1109 seconds | 1264 seconds |
| Comparative example 3 | 300 Å | Mirror surface | 473 seconds | 1211 seconds | 1381 seconds |
| Comparative example 4 | 500 Å | Mirror surface | 795 seconds | 1271 seconds | 1449 seconds |

The present invention will be illustrated in detail below, but the present invention is not limited to these examples.

EXAMPLES 1 AND 2 AND COMPARATIVE EXAMPLE 1

A mirror-polished sapphire C plane was cut off by 0.15° toward an m axis direction and used as a substrate. Growth was effected by a two-step growth method using a low temperature growth buffer layer. First, a substrate was installed on a susceptor in an MOVPE growth furnace, and heated up to 1100° C. while feeding hydrogen, then, subjected to etching for 15 seconds in an atmosphere of 0.2% hydrogen chloride. Feeding of hydrogen chloride was once terminated and kept for 1 minute and 45 seconds, then, the above-mentioned hydrogen chloride was fed for 15 seconds again, and etching was performed. Thus, a cycle of etching for 15 seconds and break for 1 minute and 45 seconds was performed 8 times.

Next, the temperature was raised up to 415° C., and an AlN low temperature growth buffer layer was grown using TMA and ammonia as a raw material and hydrogen as a carrier gas. The growing time of the AlN low temperature growth buffer layer was 1 minute, 2 minutes or 3 minutes, three levels (Examples 1, 2, and Comparative Example 1). Regarding film thickness, growth speed measured from the thickness of a layer grown for a longer period of time under the same condition was 33.3 Å/minute. Therefore, the film thicknesses measured from the above-mentioned growth time can be calculated to be 33 Å, 67 Å and 100 Å, respectively.

Next, feeding of TMA was stopped, the temperature was raised up to 1090° C., and as high temperature growth, using

REFERENCE EXAMPLE 1

A mirror-polished sapphire C plane was cut off by 0.15° toward the m axis direction and used as a substrate, which was installed on a susceptor in a MOVPE growth furnace, and heated up to 1100° C. while feeding hydrogen, and then, subjected to etching for 15 seconds in an atmosphere of 0.2% hydrogen chloride. Feeding of hydrogen chloride was once terminated and kept for 1 minute and 45 seconds. Then, the above-mentioned hydrogen chloride was fed for 15 seconds again, and etching was performed. Thus, a cycle of etching for 15 seconds and break for 1 minute and 45 seconds was performed 8 times.

The surface morphology of the above-mentioned substrate was observed by an atomic force microprobe (AFM). As a result, the whole pit density was $4 \times 10^9$ $cm^{-2}$, and the density of pits having a major axis of at least about 20 nm and having a ratio of the maximum depth to the major axis of a pit of at least about 0.05 was $1.5 \times 10^9$ $cm^{-2}$.

REFERENCE EXAMPLE 2

Etching of a substrate was conducted in the same manner as in Reference Example 1 except that a cycle of etching for 15 seconds and break for 1 minute and 45 seconds was performed 23 times.

This etched substrate was observed by AFM. As a result, the density of pits having a major axis of at least about 20 nm and having a ratio of the maximum depth to the major axis of at least about 0.05 was $1\times10^9$ cm$^{-2}$.

REFERENCE EXAMPLE 3

A mirror-polished sapphire C plane was cut off by 0.15° toward the m axis direction and used as a substrate, which was installed on a susceptor in an MOVPE growth furnace, and heated up to 1100° C. while feeding hydrogen, and then, kept for 15 minutes.

The surface morphology of the above-mentioned substrate was observed by AFM. As a result, the density of pits having a major axis of at least about 20 nm was $4\times10^8$ cm$^{-2}$, while the density of pits having a major axis of at least about 20 nm and having a ratio of the maximum depth to the major axis of at least about 0.05 was less than $1\times10^7$ cm$^{-2}$ (when one object is present in an area of 10 μm$^2$, the density of the object was $1\times10^7$ cm$^{-2}$).

EXAMPLE 3

Growth was conducted in the same manner as in Example 2, using the substrate obtained in Reference Example 2. X ray rocking curves of (004) and (302) reflection were measured, and crystallinity of tilt and twist was evaluated. The results are shown in Table 1.

COMPARATIVE EXAMPLE 2

Growth was conducted in the same manner as in Example 2, except that the substrate obtained in Reference Example 1 was used and the thickness of the AlN buffer layer was 200 Å. X ray rocking curves of (004) and (302) reflection were measured, and crystallinity of tilt and twist was evaluated. The results are shown in Table 1.

COMPARATIVE EXAMPLES 3 AND 4

Growth was conducted in the same manner as in Example 2, except that the substrate obtained in Reference Example 3 was used and the thickness of the AlN buffer layer was 300 Å or 500 Å. X ray rocking curves of (004) and (302) reflection were measured, and crystallinity of tilt and twist was evaluated. The results are shown in Table 1.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for producing a Group III-V compound semiconductor with a crystal layer, comprising forming a buffer layer of the general formula $In_uGa_vAl_wN$ (wherein $0\leq u\leq 1$, $0\leq v\leq 1$, $0\leq w\leq 1$, u+v+w=1) directly on a substrate to give a buffer layer thickness of at least about 5 Å and not more than about 90 Å at temperatures lower than a growing temperature of the compound semiconductor crystal layer before growing the compound semiconductor crystal layer, then growing a Group III-V compound semiconductor crystal layer of the general formula $In_xGa_yAl_zN$ (wherein $0\leq x\leq 1$, $0\leq y\leq 1$, $0\leq z\leq 1$, x+y+z=1) on the buffer layer, wherein there is no intermediate layer between the buffer and the substrate, and wherein the substrate consists essentially of sapphire and comprises pits having a ratio of a maximum depth to a major axis of 0.05 to 0.5.

2. The production method according to claim 1, wherein the buffer layer has a form of an amorphous and/or fine crystal.

3. The production method according to claim 1, wherein the substrate has pits having a major axis of at least about 20 nm and having a ratio of a maximum depth to the major axis of at least about 0.05 at a density of at least about $1\times10^7$ cm$^{-2}$ on a surface of the substrate on which the buffer layer is to be laminated.

4. The production method according to claim 1, wherein, before formation of the buffer layer, the surface of the substrate on which the buffer layer is to be laminated is subjected to vapor phase etching to form pits having a major axis of at least about 20 nm and having a ratio of a maximum depth to the major axis of at least about 0.05 at a density of at least about $1\times10^7$ cm$^{-2}$.

5. A method for producing a Group III-V compound semiconductor with a crystal layer, comprising forming a buffer layer of the general formula $In_uGa_vAl_wN$ (wherein $0\leq u\leq 1$, $0\leq v\leq 1$, $0.5\leq w\leq 1$, u+v+w=1) directly on a substrate to give a buffer layer thickness of at least about 5 Å and not more than about 90 Å at temperatures lower than a growing temperature of the compound semiconductor crystal layer before growing the compound semiconductor crystal layer, then growing a Group III-V compound semiconductor crystal layer of the general formula $In_xGa_yAl_zN$ (wherein $0\leq x\leq 1$, $0\leq y\leq 1$, $0\leq z\leq 1$, x+y+z=1) on the buffer layer, wherein there is no intermediate layer between the buffer and the substrate, and wherein the substrate consists essentially of sapphire and comprises pits having a ratio of a maximum depth to a major axis of 0.05 to 0.5.

6. A method for producing a Group III-V compound semiconductor with a crystal layer, comprising forming a buffer layer of the general formula $In_uGa_vAl_wN$ (wherein $0\leq u\leq 1$, $0\leq v\leq 1$, $0\leq w\leq 1$, u+v+w=1) directly on and in direct contact with a substrate to give a buffer layer thickness of at least about 5 Å and not more than about 90 Å at temperatures lower than a growing temperature of the compound semiconductor crystal layer before growing the compound semiconductor crystal layer, then growing a Group III-V compound semiconductor crystal layer of the general formula $In_xGa_yAl_zN$ (wherein $0\leq x\leq 1$, $0\leq y\leq 1$, $0\leq z\leq 1$, x+y+z=1) on the buffer layer, wherein the substrate consists essentially of sapphire and comprises pits having a ratio of the maximum depth to the major axis of 0.05 to 0.5.

7. The production method according to claim 6, wherein the buffer layer has a form of an amorphous and/or fine crystal.

8. The production method according to claim 6, wherein the substrate has pits having a major axis of at least about 20 nm and having a ratio of a maximum depth to the major axis of at least about 0.05 at a density of at least about $1\times10^7$ cm$^{-2}$ on a surface of the substrate on which the buffer layer is to be laminated.

9. The production method according to claim 6, wherein, before formation of the buffer layer, the surface of the substrate on which the buffer layer is to be laminated is subjected to vapor phase etching to form pits having a major axis of at least about 20 nm and having a ratio of a maximum depth to the major axis of at least about 0.05 at a density of at least about $1\times10^7$ cm$^{-2}$.

10. The production method according to claim 6, wherein the buffer layer has the general formula $In_uGa_vAl_wN$ (wherein $0\leq u\leq 1$, $0\leq v\leq 1$, $0.5\leq w\leq 1$, u+v+w=1).

11. A method for producing a Group III-V compound semiconductor with a crystal layer, comprising forming a buffer layer comprising AlN or InGaAlN having an AlN crystal mixing ratio of 50% or more directly on a substrate to give a buffer layer thickness of at least about 5 Å and not more than about 90 Å at temperatures lower than a growing temperature of the compound semiconductor crystal layer before growing the compound semiconductor crystal layer, then growing a Group III-V compound semiconductor crystal layer of the general formula $In_xGa_yAl_zN$ (wherein $0 \leq x \leq 1$, $0 \leq y \leq 1$, $0 \leq z \leq 1$, $x+y+z=1$) on the buffer layer, wherein the substrate comprises pits having a ratio of a maximum depth to a major axis of 0.05 to 0.5.

12. A method for producing a Group III-V compound semiconductor with a crystal layer, comprising forming a buffer layer comprising AlN or InGaAlN having an AlN crystal mixing ratio of 50% or more directly on and in direct contact with a substrate to give a buffer layer thickness of at least about 5 Å and not more than about 90 Å at temperatures lower than a growing temperature of the compound semiconductor crystal layer before growing the compound semiconductor crystal layer, then growing a Group III-V compound semiconductor crystal layer of the general formula $In_xGa_yAl_zN$ (wherein $0 \leq x \leq 1$, $0 \leq y \leq 1$, $0 \leq z \leq 1$, $x+y+z=1$) on the buffer layer, wherein the substrate comprises pits having a ratio of the maximum depth to the major axis of 0.05 to 0.5.

* * * * *